United States Patent
Severson et al.

(10) Patent No.: US 10,415,903 B2
(45) Date of Patent: Sep. 17, 2019

(54) PREVENTION OF COOLING FLOW BLOCKAGE

(71) Applicant: Hamilton Sundstrand Corporation, Charlotte, NC (US)

(72) Inventors: Mark Hamilton Severson, Rockford, IL (US); Mark W. Metzler, Davis, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 501 days.

(21) Appl. No.: 14/515,151

(22) Filed: Oct. 15, 2014

(65) Prior Publication Data

US 2016/0109197 A1    Apr. 21, 2016

(51) Int. Cl.
F28F 3/12    (2006.01)
F28F 19/00    (2006.01)
(Continued)

(52) U.S. Cl.
CPC ............ F28F 27/02 (2013.01); F28F 1/00 (2013.01); F28F 1/10 (2013.01); F28F 3/12 (2013.01); F28F 13/08 (2013.01); F28F 19/002 (2013.01); F28F 19/01 (2013.01); H05K 7/20254 (2013.01); H05K 7/20927 (2013.01); *F28F 1/40* (2013.01); *F28F 3/048* (2013.01); *F28F 2210/02* (2013.01); *F28F 2210/10* (2013.01); *F28F 2220/00* (2013.01); *F28F 2250/06* (2013.01)

(58) Field of Classification Search
CPC .. F28F 27/02; F28F 1/10; F28F 19/002; F28F 19/01; F28F 3/12; F28F 2220/00; F28F 2210/02; F28F 1/00; F28F 1/006; F28F 1/40; F28F 13/08; F28F 3/048; F28F 2210/10; F28F 2250/06; F28F 3/02; H05K 7/20254; H05K 7/20927; H01L 23/473

USPC .................. 165/71, 103; 138/38, 39, 42, 95
See application file for complete search history.

(56) References Cited

U.S. PATENT DOCUMENTS 2,183,956 A * 12/1939 Campbell ............. F28D 9/0081
                                                                165/110
3,194,309 A *  7/1965 Adams ................. B21D 53/045
                                                                165/170
(Continued)

OTHER PUBLICATIONS

Perma Pure LLC, Inertial Bypass Filter, Bulletin 122, downloaded from: http://www.permapure.com/products/gas-drying-systems/accessories-for-sample-conditioning/fb-series-inertial-bypass-filter/.*

(Continued)

*Primary Examiner* — Cassey D Bauer
*Assistant Examiner* — Miguel A Diaz
(74) *Attorney, Agent, or Firm* — Kinney & Lange, P.A.

(57) ABSTRACT

A fluid cooled cold plate includes a main coolant passage with a first cross-sectional area taken laterally in a direction perpendicular to the flow direction and a finned coolant passage having a second cross-sectional area taken laterally in a direction perpendicular to the flow direction, with the second area smaller than the first area. Fluidly connecting the main coolant passage with the finned coolant passage is a branch oriented such that a fluid is turned 90° or more when passing into the branch from the main coolant passage. Also included is a coolant bypass passage in fluid communication with the main coolant passage and located fluidically parallel to the finned coolant passage.

15 Claims, 3 Drawing Sheets

(51) Int. Cl.
*F28F 19/01* (2006.01)
*F28F 13/08* (2006.01)
*F28F 27/02* (2006.01)
*H05K 7/20* (2006.01)
*F28F 1/10* (2006.01)
*F28F 1/00* (2006.01)
*F28F 3/04* (2006.01)
*F28F 1/40* (2006.01)

(56) References Cited

U.S. PATENT DOCUMENTS

| | | | | |
|---|---|---|---|---|
| 3,419,069 A * | 12/1968 | Baker | ............... | F28D 1/0213 165/132 |
| 3,424,238 A * | 1/1969 | McWilliams | ............ | F28F 3/12 165/133 |
| 3,847,298 A * | 11/1974 | Hamilton | ............... | B01J 19/14 137/209 |
| 4,268,850 A * | 5/1981 | Lazarek | ............... | F28F 3/12 165/80.4 |
| 4,765,397 A * | 8/1988 | Chrysler | ............ | H01L 23/473 165/104.33 |
| 5,016,090 A * | 5/1991 | Galyon | ............ | H01L 23/4336 257/714 |
| 5,131,807 A * | 7/1992 | Fischer | ............... | F01D 25/22 415/111 |
| 5,219,020 A * | 6/1993 | Akachi | ............... | F28D 15/02 165/104.14 |
| 5,309,319 A * | 5/1994 | Messina | ............ | H01L 23/4336 165/142 |
| 5,562,156 A * | 10/1996 | Ogawa | ............... | F28D 1/0213 165/133 |
| 5,613,552 A * | 3/1997 | Osakabe | ............ | F28D 15/0233 165/104.21 |
| 5,927,396 A * | 7/1999 | Damsohn | ............ | F28D 9/0062 165/135 |
| 6,668,915 B1 * | 12/2003 | Materna | ............... | F28F 1/10 165/146 |
| 6,875,619 B2 * | 4/2005 | Blackburn | ............ | B01J 19/0093 435/287.1 |
| 7,185,697 B2 * | 3/2007 | Goodson | ............ | F04B 19/006 165/104.33 |
| 7,265,979 B2 * | 9/2007 | Erturk | ............ | H01L 23/427 257/713 |
| 7,320,178 B2 * | 1/2008 | Kirby | ............ | B22D 19/0072 148/594 |
| 7,334,630 B2 * | 2/2008 | Goodson | ............ | F04B 19/006 165/104.33 |
| 8,104,532 B2 * | 1/2012 | Cardone | ............ | F28D 1/035 165/48.1 |
| 8,801,922 B2 * | 8/2014 | Wrazel | ............ | A61M 1/16 210/137 |
| 8,955,507 B2 * | 2/2015 | Khan | ............ | F24H 3/087 126/114 |
| 9,526,191 B2 * | 12/2016 | Straznicky | ............ | H05K 7/20 |
| 9,581,395 B2 * | 2/2017 | Nehlen, III | ............ | F28D 7/16 |
| 2003/0102115 A1 * | 6/2003 | Lengauer, Jr. | ............ | F24H 3/105 165/170 |
| 2003/0190608 A1 * | 10/2003 | Blackburn | ............ | B01J 19/0093 435/6.11 |
| 2003/0217738 A1 * | 11/2003 | Ryon | ............ | F02M 31/20 123/541 |
| 2004/0089442 A1 * | 5/2004 | Goodson | ............ | F04B 19/006 165/104.11 |
| 2004/0091760 A1 * | 5/2004 | Mizutani | ............ | H01M 8/2485 429/444 |
| 2004/0182548 A1 * | 9/2004 | Lovette | ............ | F28F 3/12 165/103 |
| 2005/0205241 A1 * | 9/2005 | Goodson | ............ | F04B 19/006 165/80.4 |
| 2005/0237714 A1 * | 10/2005 | Ebermann | ............ | H05K 7/20754 361/695 |
| 2005/0245789 A1 * | 11/2005 | Smith | ............ | A61B 1/00059 600/159 |
| 2008/0173431 A1 * | 7/2008 | Yang | ............ | F28D 15/0233 165/104.33 |
| 2008/0223555 A1 * | 9/2008 | Di Stefano | ............ | F25B 49/02 165/101 |
| 2009/0211977 A1 * | 8/2009 | Miller | ............ | B01D 63/082 210/646 |
| 2009/0266513 A1 * | 10/2009 | Xiong | ............ | H01L 23/427 165/80.3 |
| 2010/0290190 A1 * | 11/2010 | Chester | ............ | H05K 7/20772 361/701 |
| 2011/0058638 A1 * | 3/2011 | Ahlfeld | ............ | G21C 1/026 376/456 |
| 2011/0088881 A1 * | 4/2011 | Yang | ............ | F28D 1/0477 165/157 |
| 2011/0094708 A1 * | 4/2011 | Cardone | ............ | F28D 1/035 165/48.1 |
| 2012/0118549 A1 * | 5/2012 | Rowe | ............ | F28D 15/00 165/185 |
| 2013/0020063 A1 * | 1/2013 | Fetvedt | ............ | F28F 3/04 165/168 |
| 2013/0299132 A1 | 11/2013 | Guilford | | |
| 2015/0276236 A1 * | 10/2015 | Dixon | ............ | F24D 3/082 62/235.1 |
| 2015/0361922 A1 * | 12/2015 | Alvarez | ............ | F28D 9/0081 165/185 |
| 2016/0282023 A1 * | 9/2016 | Matsunaga | ............ | F28D 15/06 |
| 2016/0290691 A1 * | 10/2016 | Chiba | ............ | F25B 41/003 |

OTHER PUBLICATIONS

Perma Pure LLC, Inertial Bypass Filter, Bulletin 122, downloaded from: http://www.permapure.com/products/gas-drying-systems/accessories-for-sample-conditioning/fb-series-inertial-bypass-filter/ (Year: 2018).*

Extended European Search Report, for European Patent Application No. 15189501.8, dated Mar. 21, 2016, 7 pages.

* cited by examiner

PREVENTION OF COOLING FLOW BLOCKAGE

BACKGROUND

The present embodiments relate to fluid cooled cold plates, and specifically to the prevention of coolant flow passage blockage within fluid cooled cold plates.

Electronic devices, and particularly high power electronic devices, dissipate heat which if not accounted for can cause the electronic devices to overheat and fail. As a result, electronic devices require cooling for reliable operation. Often, cold plates are used to cool electronic devices. A cold plate receives a fluid from a cooling system and passes the fluid through cold plate coolant flow passages, which can have varying sizes and shapes within a single cold plate. The cold plate can be positioned so as to interface with an electronic device to provide convective cooling.

While the use of fluid cooled cold plates to provide cooling to electronic devices is very effective thermally, fluid cooled cold plates can be susceptible to flow passage blockage. Cold plate flow passage blockage can result in insufficient cooling and ultimately failure of the electronic device. Therefore, it is desired to provide a fluidic cooling system which provides suitable cooling flow with a reduced risk of flow blockage.

SUMMARY

One embodiment includes a fluid cooled cold plate having a main coolant passage with a first cross-sectional area taken laterally in a direction perpendicular to the flow direction and a finned coolant passage having a second cross-sectional area taken laterally in a direction perpendicular to the flow direction, with the second area smaller than the first area. Fluidly connecting the main coolant passage with the finned coolant passage is a branch oriented such that a fluid is turned 90° or more when passing into the branch from the main coolant passage. Also included is a coolant bypass passage in fluid communication with the main coolant passage and located fluidically parallel to the finned coolant passage.

Another embodiment includes a method for preventing cooling flow blockage in a fluid cooled cold plate. The method includes passing a fluid with an entrained contaminate through a main coolant passage having a first cross-sectional area taken laterally in a direction perpendicular to the flow direction. The fluid with an entrained contaminate larger than a finned coolant passage is bypassed past a branch that is oriented such that the fluid is turned 90° or more when passing into the branch from the main coolant passage. The branch is in fluid connection with the main coolant passage on a first end and the finned coolant passage on a second end, with the finned coolant passage having a second cross-sectional area taken laterally in a direction perpendicular to the flow direction, where the second area is smaller than the first area. The fluid with the entrained contaminate larger than the finned coolant passage is directed through a coolant bypass passage in fluid communication with the main coolant passage and fluidically parallel to the finned coolant passage.

Figure 1:
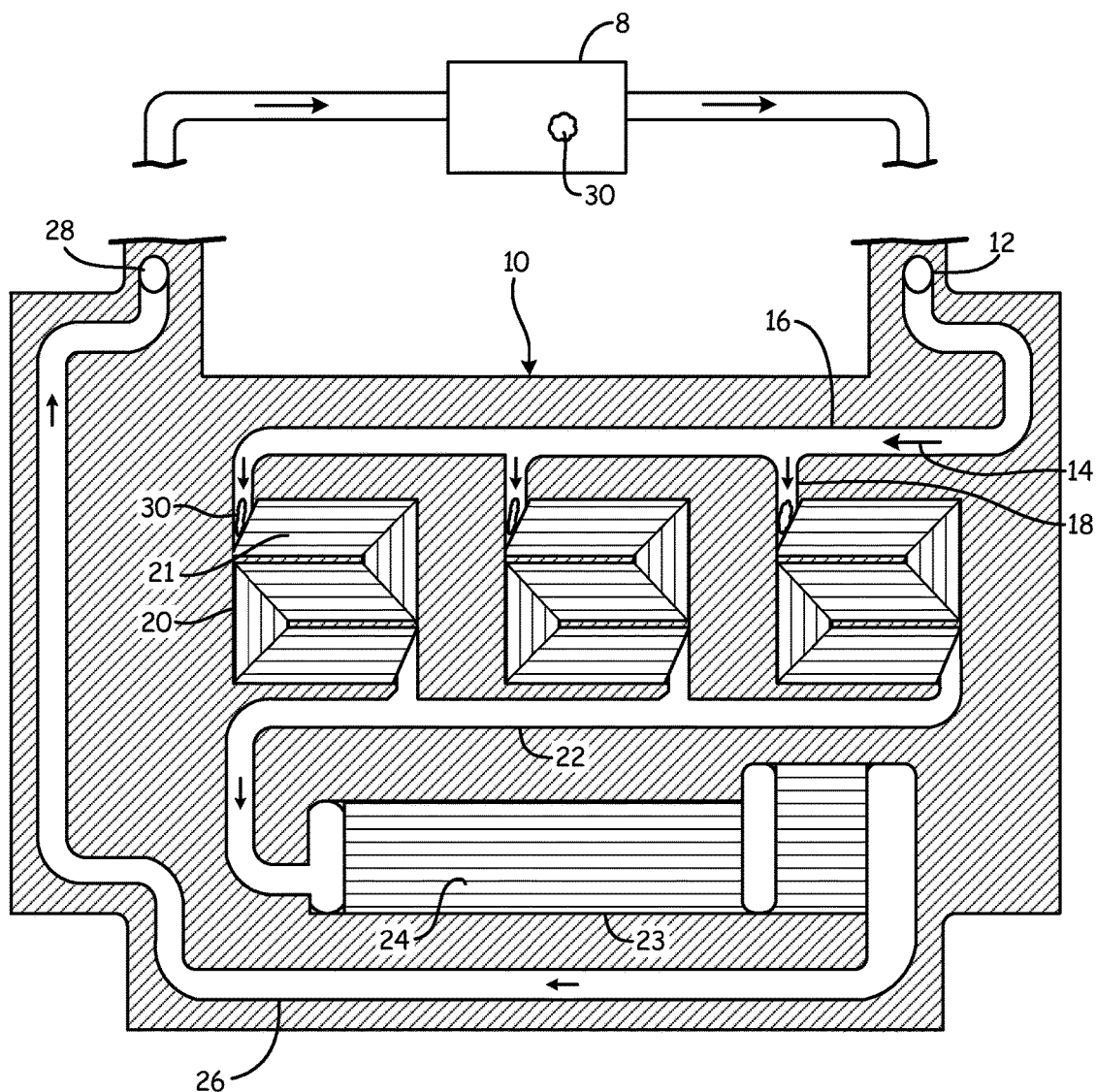
FIG. 1 is a cross-sectional view of a prior art cold plate.

While the above-identified drawing figures set forth multiple embodiments of the invention, other embodiments are also contemplated. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

FIG. 1 shows a cross-sectional view of a prior art cold plate 10. Cold plate 10 includes inlet 12, fluid coolant 14 (designated by arrows), main coolant passage 16, branches 18, finned coolant passage sets 20 each including multiple finned coolant passages 21, intermediate coolant passage 22, downstream finned coolant passage set 23 including multiple downstream finned coolant passages 24, return coolant passage 26, and outlet 28.

Cooling system 8, which can be, for example, a central cooling system, is in fluid communication with inlet 12 such that cooling system 8 provides fluid 14 in a relatively cold state to cold plate 10 through inlet 12. From inlet 12, fluid 14 passes into main coolant passage 16. Branches 18 are fluidly connected between main coolant passage 16 and finned coolant passage sets 20, such that fluid 14 is conveyed from main coolant passage 16 downstream into finned coolant passages 21 via branches 18. Finned coolant passages 21 (and downstream finned coolant passages 24) have smaller areas, taken laterally in a direction perpendicular to the fluid 14 flow direction, than main coolant passage 16. After passing through finned coolant passages 21, fluid 14 re-collects at intermediate coolant passage 22 and passes through downstream finned coolant passage set 23. After exiting downstream finned coolant passages 24, fluid 14 is conveyed by return coolant passage 26 to outlet 28 where fluid 14 can be returned to cooling system 8 and/or used in another cold plate.

The embodiment of cold plate 10 as illustrated shows three finned coolant passage sets 20 fluidically arranged in parallel. However, various configurations of passages 16, 21, 22, 24, and 26 can be used in a given cold plate depending on the specific cooling needs of an electronic device. For example, the number of finned coolant passage sets 20, as well as the number of finned coolant passages 21 that make up each set 20, can vary depending on the particular application of cold plate 10. Also, finned coolant passage sets 20, as well as finned coolant passages 21, can vary so as to be in parallel, as shown in FIG. 1, in series, and/or a combination of parallel and series sets 20 and passages 21 depending on the particular application of cold plate 10.

When cold plate 10 is positioned so as to interface with an electronic device, cold plate 10 is capable of providing cooling to the electronic device by means of the flow of fluid 14 through cold plate 10. For example, because finned coolant passage sets 20 increase surface area for convective thermal energy transfer and thereby promote a greater heat exchange function, finned coolant passage sets 20 can be positioned within cold plate 10 so as to interface with areas of the electronic device which require greater cooling. However, prior art cold plates, such as cold plate 10, can fail to effectively cool an electronic device when fluid 14 is prevented from passing through cold plate 10 from inlet 12 to outlet 28.

Fluid 14 can be prevented from passing through cold plate 10 when the coolant passages in cold plate 10 become blocked. Fluid 14 supplied by cooling system 8 to cold plate 10 often contains entrained contaminates 30 that are conveyed through inlet 12 and into main coolant passage 16. In many instances contaminates 30 will pass through the relatively large area of main coolant passage 16, but create blockage at an inlet to the relatively smaller area of finned coolant passages 21. When contaminates 30 wholly or partially block one or more finned coolant passages 21, for example, cold plate 10 can be unable to meet the cooling needs of the particular application.

Figure 2:
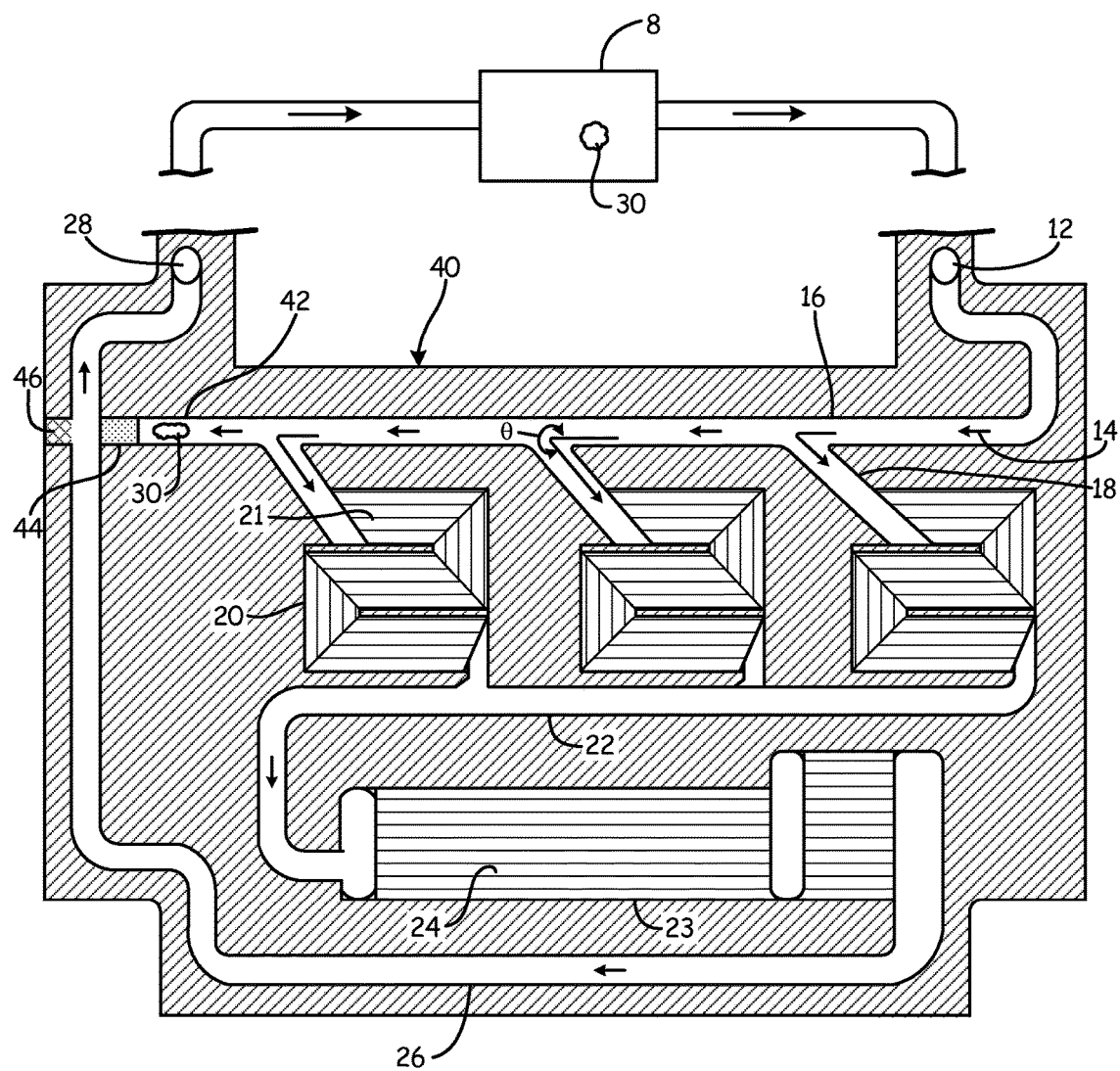
FIG. 2 is a cross-sectional view of an embodiment of a cold plate with a coolant bypass passage.

FIG. 2 is a cross-sectional view of an embodiment of cold plate 40 which can prevent blockage of cold plate 40, including finned coolant passages 21. Cold plate 40 is similar to that described above for prior art cold plate 10, but includes the differences noted below.

Cold plate 40 has branches 18 oriented such that fluid 14 is turned at an angle θ which is 90° or more when fluid 14 passes into branches 18 from main coolant passage 16. Cold plate 40 also has coolant bypass passage 42 in fluid communication with main coolant passage 16 on one end and return coolant passage 26 on another end. Coolant bypass passage 42 is fluidly connected to main coolant passage 16 such that a continuous, straight (i.e. linear) fluid 14 passage to return coolant passage 26 is defined by main coolant passage 16 and coolant bypass passage 42. Coolant bypass passage 42 is located fluidically parallel to finned coolant passages 21, meaning the same fluid 14 does not pass through both coolant bypass passage 42 and finned coolant passages 21 (i.e. one portion of fluid 14 passes through coolant bypass passage 42 and the other portion of fluid 14 passes through branches 18).

Cold plate 40 works to prevent blockage of, for example, finned coolant passages 21 by using fluid 14 momentum to carry contaminates 30 (e.g., solid particulates) entrained in fluid 14 to coolant bypass passage 42, so that contaminates 30 do not pass to smaller area finned coolant passages 21. Orienting branches 18 such that fluid 14 is turned at an angle θ which is 90° or more when fluid 14 passes into branches 18 from main coolant passage 16 helps to prevent contaminates 30 from entering branches 18 and instead, in combination with fluid 14 momentum along the straight passage, directs contaminates 30 along main coolant passage 16 to coolant bypass passage 42. Smaller contaminates 30, such as those contaminates 30 which are smaller than the inlet of finned coolant passages 21, will not experience as great of fluid 14 momentum as larger contaminates 30, and thus are more likely to turn 90° or more and be directed into branches 18. However, these smaller contaminate 30 generally will not cause significant blockage, and can safely pass through cold plate 40, including finned coolant passages 21. As a result, large contaminates 30 entrained in fluid 14 flush past branches 18, and thus the smaller area finned coolant passages 21, preventing or minimizing instances of cold plate 40 blockage.

In the embodiment illustrated in FIG. 2, coolant bypass passage 42 includes filter element 44. As contaminates 30 flush past branches 18 and enter coolant bypass passage 42, filter element 44 allows fluid 14 to pass into return coolant passage 26 but retains contaminates 30 at coolant bypass passage 42. Filter element 44 can have sieves sized such that contaminates 30 which are as large as or larger than an inlet to finned coolant passages 21 are prevented from passing through filter element 44. Coolant bypass passage 42 also includes a removable plug 46. Removable plug 46 can allow for service of coolant bypass passage 42.

Figure 3:
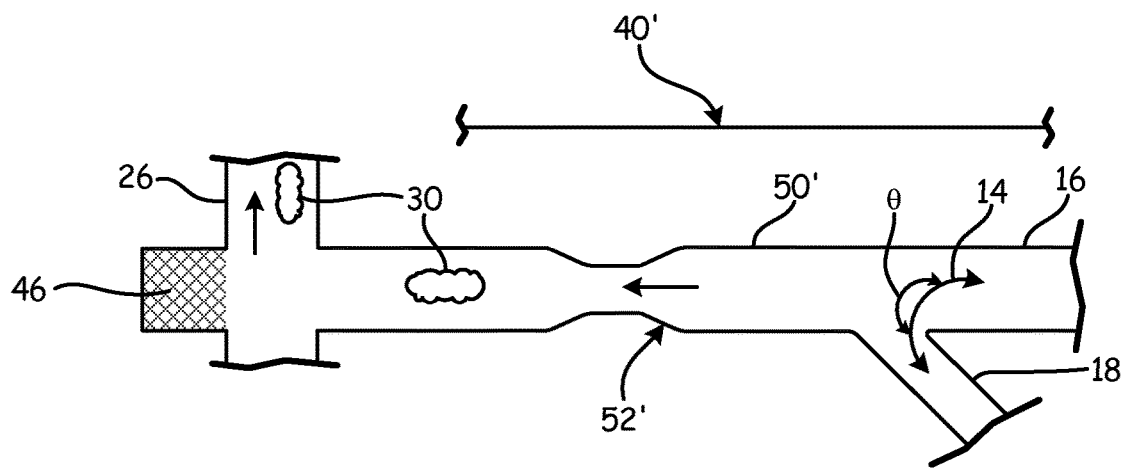
FIG. 3 is a cross-sectional view of the cold plate of FIG. 2 with another embodiment of a coolant bypass passage.
Figure 4:
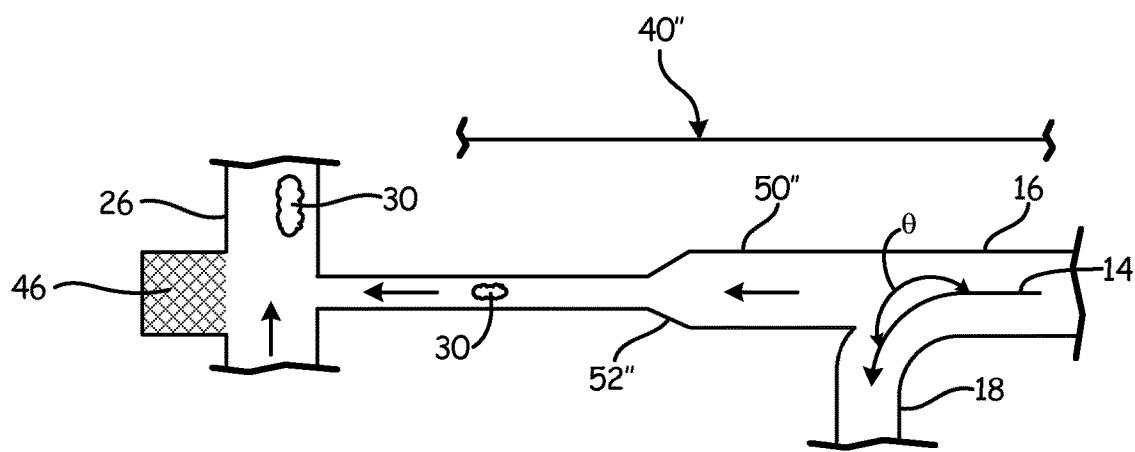
FIG. 4 is a cross-sectional view of the cold plate of FIG. 2 with a further embodiment of a coolant bypass passage.

FIGS. 3 and 4 show portions of cold plates 40' and 40", respectively, similar to FIG. 2 with further embodiments of coolant bypass passages 50' and 50". Coolant bypass passages 50' and 50" of cold plates 40' and 40" do not have filter element 44 to retain contaminates 30 in coolant bypass passages 50' and 50", instead contaminates 30 pass through coolant bypass passages 50' and 50" having flow balance mechanisms 52' and 52", enter return coolant passage 26 and ultimately exit cold plates 40' and 40" at outlet 28. Therefore, use of coolant bypass passages 50' and 50" removes contaminates 30 from cold plates 40' and 40" which can cause blockage.

Because fluid 14 which passes through coolant bypass passages 50' and 50" does not circulate through other passages of cold plates 40' and 40" (i.e. fluid 14 which passes through coolant bypass passages 50' and 50" enters return coolant passage 26 and exits cold plates 40' and 40" at outlet 28), such as finned coolant passages 21, fluid 14 which passes through coolant bypass passages 50' and 50" does not significantly contribute to the cooling provided by cold plates 40' and 40". In other words, fluid 14 which passes through coolant bypass passages 50' and 50" is substantially wasted in terms of cooling contribution. In one embodiment, a volume of fluid 14 which passes through coolant bypass passages 50' and 50" is 10-20% of the total volume of fluid 14 which is within cold plates 40' and 40" at any one time. Therefore, it is desirable to limit the volume of fluid 14 which passes through coolant bypass passages 50' and 50", yet still direct enough fluid 14 towards and through coolant bypass passages 50' and 50" to allow fluid 14 momentum to flush contaminates 30 past branches 18.

Coolant bypass passages 50' and 50" include flow balance mechanisms 52' and 52" to balance a flow resistance between fluid 14 which enters coolant bypass passages 50' and 50", and fluid 14 which enters branches 18. This minimizes the flow of fluid 14 through bypass passages 50' and 50", increasing the cooling effectiveness of cold plates 40' and 40" while reducing or eliminating risk of blockage. Flow balance mechanisms 52' and 52" can be permanent or removable from bypass passages 50' and 50" (e.g. for maintenance). Flow balance mechanism 52' shown in FIG. 3 is a converging-diverging nozzle, which balances the flow resistance between fluid 14 which enters coolant bypass passage 50' and fluid 14 which enters branches 18 by restricting a volume of fluid 14 which can pass through coolant bypass passage 50' at any one time, in turn increasing a volume of fluid 14 which passes through branches 18 as compared to coolant bypass passage 50' without flow balance mechanism 52'. The particular converging-diverging nozzle dimensions can be optimized depending on the cooling needs of the particular application of cold plate 40'.

Flow balance mechanism 52" shown in FIG. 4 is a converging nozzle (i.e. reduction in area of passage 50" taken laterally in a direction perpendicular to fluid 14 flow direction) which extends axially until the fluid connection with passage 26. Flow balance mechanism 52" of FIG. 4 adds a pressure drop which helps to balance the flow resistance between fluid 14 which enters coolant bypass passage 50" and fluid 14 which enters branches 18. Similarly, the particular dimensions of the converging nozzle can be optimized depending on the cooling needs of the particular application of cold plate 40".

In other embodiments, flow balance mechanisms 52' and 52" can be any mechanism which assists in balancing the flow resistance between fluid 14 which enters coolant bypass passages 50' and 50", and fluid 14 which enters branches 18. For example, instead of a converging-diverging nozzle, an orifice can be added to coolant bypass passage 50' (i.e. a plate having a hole which is smaller than the area of passage 50' taken laterally in a direction perpendicular to fluid 14 flow direction). If contaminates 30 are desired to be directed out of cold plates 40' and 40", flow balance mechanisms 52' and 52" should have an area, taken laterally in a direction perpendicular to fluid 14 flow direction, which is greater than a size of contaminates 30 which can cause blockage. Coolant bypass passages 50' and 50" and/or flow balance mechanism 52' and 52" are structured in a manner such that retrofitting a cold plate with coolant bypass passages 50' and 50" and/or flow balance mechanism 52' and 52" is possible.

Discussion of Possible Embodiments

The following are non-exclusive descriptions of possible embodiments of the present invention.

A fluid cooled cold plate comprising: a main coolant passage having a first cross-sectional area taken laterally in a direction perpendicular to the flow direction; a finned coolant passage having a second cross-sectional area taken laterally in a direction perpendicular to the flow direction, wherein the second area is smaller than the first area; a branch fluidly connecting the main coolant passage with the finned coolant passage, wherein the branch is oriented such that a fluid is turned 90° or more when passing into the branch from the main coolant passage; and a coolant bypass passage in fluid communication with the main coolant passage and located fluidically parallel to the finned coolant passage.

The fluid cooled cold plate of the preceding paragraph can optionally include, additionally and/or alternatively, any one or more of the following features, configurations and/or additional components:

The coolant bypass passage is fluidly connected with the main coolant passage to form a continuous straight passage.

The coolant bypass passage includes a flow balance mechanism.

The flow balance mechanism comprises a converging-diverging nozzle.

The flow balance mechanism comprises a filter element.

The coolant bypass passage includes a removable plug.

The main coolant passage is in fluid communication with a central cooling system.

The finned coolant passage is located downstream of the main coolant passage.

A method for preventing cooling flow blockage in a fluid cooled cold plate, the method comprising: passing a fluid with an entrained contaminate through a main coolant passage having a first cross-sectional area taken laterally in a direction perpendicular to the flow direction; bypassing a fluid with an entrained contaminate larger than a finned coolant passage past a branch, wherein the branch is oriented such that the fluid is turned 90° or more when passing into the branch from the main coolant passage, and wherein the branch is in fluid connection with the main coolant passage on a first end and the finned coolant passage on a second end having a second cross-sectional area taken laterally in a direction perpendicular to the flow direction, and wherein the second area is smaller than the first area; and directing the fluid with the entrained contaminate larger than the finned coolant passage through a coolant bypass passage in fluid communication with the main coolant passage and fluidically parallel to the finned coolant passage.

The method of the preceding paragraph can optionally include, additionally and/or alternatively, the following techniques, steps, features and/or configurations:

Directing the fluid with the entrained contaminate larger than the finned coolant passage through the coolant bypass passage comprises directing the fluid along a continuous straight passage from the main coolant passage.

Passing the fluid with an entrained contaminate smaller than the second area and the fluid substantially free of contaminates through the branch.

Balancing a flow resistance between the fluid that passes through the branch and the fluid that passes through the coolant bypass passage.

The flow resistance between the fluid that passes through the branch and the fluid that passes through the coolant bypass passage is balanced by passing the fluid through a converging-diverging nozzle at the coolant bypass passage.

Collecting contaminates in the fluid at the coolant bypass passage.

Removing a plug on the coolant bypass passage.

Any relative terms or terms of degree used herein, such as "generally", "substantially", "approximately", and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, temporary alignment or shape variations induced by operational conditions, and the like.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, features described with respect to any given embodiment can be utilized with respect to any other disclosed embodiment, as desired for particular applications.

The invention claimed is:

1. A fluid cooled cold plate comprising:
    a main coolant passage having a first cross-sectional area taken laterally in a direction perpendicular to a flow direction of the main coolant passage;
    a finned coolant passage having a second cross-sectional area taken laterally in a direction perpendicular to the flow direction of the main coolant passage, wherein the second cross-sectional area is smaller than the first cross-sectional area;
    a branch fluidly connecting the main coolant passage with the finned coolant passage, wherein the branch is turned more than 90° from the flow direction of the main coolant passage, such that fluid flowing through the branch is reversed from the flow direction of the main coolant passage by turning more than 90° from the flow direction of the main coolant passage to prevent contaminants from flowing into the branch from the main coolant passage; and a coolant bypass passage in fluid communication with the main coolant passage and located fluidically parallel to the finned coolant passage such that fluid configured to flow through the fluid cooled cold plate passes through either the coolant bypass passage or the finned coolant passage.

2. The fluid cooled cold plate of claim 1, wherein the coolant bypass passage is fluidly connected with the main coolant passage to form a continuous straight passage.

3. The fluid cooled cold plate of claim 1, wherein the coolant bypass passage includes a filter element.

4. The fluid cooled cold plate of claim 1, wherein the coolant bypass passage includes a removable plug.

5. The fluid cooled cold plate of claim 1, wherein the coolant bypass passage includes a flow balance mechanism.

6. The fluid cooled cold plate of claim 5, wherein the flow balance mechanism comprises a converging-diverging nozzle.

7. The fluid cooled cold plate of claim 1, wherein the main coolant passage is in fluid communication with a central cooling system.

8. The fluid cooled cold plate of claim 7, wherein the finned coolant passage is located downstream of the main coolant passage.

9. A method for preventing a cooling flow blockage in a fluid cooled cold plate, the method comprising:

passing a fluid with entrained contaminants that are larger than a finned coolant passage through a main coolant passage having a first cross-sectional area taken laterally in a direction perpendicular to a flow direction of the main coolant passage;

bypassing a first portion of the fluid with the entrained contaminants larger than the finned coolant passage past a branch, wherein the branch is turned more than 90° from the flow direction of the main coolant passage, such that a second portion of the fluid is reversed from the flow direction of the main coolant passage by turning more than 90° from the flow direction of the main coolant passage to prevent the entrained contaminants larger than the finned coolant passage from flowing into the branch from the main coolant passage, and wherein the branch is in fluid connection with the main coolant passage on a first end and the finned coolant passage on a second end, the finned coolant passage having a second cross-sectional area taken laterally in a direction perpendicular to the flow direction, and wherein the second area is smaller than the first area; and directing the first portion of the fluid with the entrained contaminants larger than the finned coolant passage through a coolant bypass passage in fluid communication with the main coolant passage and fluidically parallel to the finned coolant passage such that fluid configured to flow through the fluid cooled cold plate passes through either the coolant bypass passage or the finned coolant passage.

10. The method of claim 9, wherein directing the first portion of the fluid with the entrained contaminants larger than the finned coolant passage through the coolant bypass passage comprises directing the first portion of the fluid with the entrained contaminants along a continuous straight passage from the main coolant passage.

11. The method of claim 9, further comprising:
collecting the entrained contaminants in the first portion of the fluid at the coolant bypass passage.

12. The method of claim 11, further comprising:
removing a plug from the coolant bypass passage.

13. The method of claim 9, further comprising:
passing a third portion of the fluid with entrained contaminants smaller than the second cross-sectional area and the second portion of the fluid through the branch.

14. The method of claim 13, further comprising:
balancing a flow resistance between the second and third portions of the fluid that pass through the branch and the first portion of the fluid that passes through the coolant bypass passage.

15. The method of claim 14, wherein the flow resistance between the second and third portions of the fluid that pass through the branch and the first portion of the fluid that passes through the coolant bypass passage is balanced by passing the first portion of the fluid through a converging-diverging nozzle at the coolant bypass passage.

* * * * *